(12) United States Patent
Akyol

(10) Patent No.: US 12,049,709 B2
(45) Date of Patent: Jul. 30, 2024

(54) METHOD FOR GROWING HIGH-QUALITY HETEROEPITAXIAL MONOCLINIC GALLIUM OXIDE CRYSTAL

(71) Applicants: YILDIZ TEKNIK UNIVERSITESI, Istabul (TR); YILDIZ TEKNOLOJI TRANSFER OFISI ANONIM SIRKETI, Esenler/İstanbul (TR)

(72) Inventor: Fatih Akyol, Istanbul (TR)

(73) Assignees: YILDIZ TEKNIK UNIVERSITESI, Istanbul (TR); YILDIZ TEKNOLOJI TRANSFER OFISI ANONIM SIRKETI, Ensenler/Istanbul (TR)

( * ) Notice: Subject to any disclaimer, the term of this patent is extended or adjusted under 35 U.S.C. 154(b) by 160 days.

(21) Appl. No.: 17/771,888

(22) PCT Filed: Jun. 1, 2021

(86) PCT No.: PCT/TR2021/050525
§ 371 (c)(1),
(2) Date: Apr. 26, 2022

(87) PCT Pub. No.: WO2022/115064
PCT Pub. Date: Jun. 2, 2022

(65) Prior Publication Data
US 2023/0151512 A1    May 18, 2023

(30) Foreign Application Priority Data
Nov. 25, 2020  (TR) ................. 2020/19031

(51) Int. Cl.
*C30B 29/16* (2006.01)
*C30B 25/10* (2006.01)
*C30B 25/14* (2006.01)

(52) U.S. Cl.
CPC ............. *C30B 29/16* (2013.01); *C30B 25/10* (2013.01); *C30B 25/14* (2013.01)

(58) Field of Classification Search
CPC ....... C30B 25/10; C30B 25/14; C30B 25/165; C30B 25/186; C30B 29/16
See application file for complete search history.

(56) References Cited

U.S. PATENT DOCUMENTS

| 2009/0061538 A1* | 3/2009 | Heo ........................ H01L 28/56 257/E21.011 |
| 2014/0331919 A1* | 11/2014 | Sasaki ............... H01L 21/02631 117/108 |

(Continued)

FOREIGN PATENT DOCUMENTS

| CN | 103 456 603 A | 12/2013 |
| CN | 110 616 456 A | 12/2019 |

(Continued)

OTHER PUBLICATIONS

Wu C et al.: "Systematic investigation of the growth kinetics of [beta]-Ga2O3 epilayer by plasma enhanced chemical vapor deposition", Applied Physics Letters, AIP Publishing LLC, U.S., vols. 116, No. 7, Feb. 19, 2020.

*Primary Examiner* — Matthew J Song
(74) *Attorney, Agent, or Firm* — Fresh IP PLC; Clifford D. Hyra; Aubrey Y. Chen

(57) ABSTRACT

Disclosed is a method for growing a high-quality heteroepitaxial β-Ga2O3 crystal by specifically using low-pressure chemical vapor deposition (LPCVD) method in the field of chemical vapor deposition, wherein said method includes the process steps of; preparing the substrate having hexagonal surfaces cut in different directions with inclinations such that the inclination angle is in a range between 2° and 10°; physically carrying the vapor obtained from Gallium heated in the second zone to the pump/sample by means of Argon (Continued)

gas; driving oxygen into the system with a separate ceramic or refractory metal tube and vertically transferring it onto the surface of the sample directly over the substrate; creating the core layer of β-Ga2O3 on the surface such that the ratio of Ga:O surface atoms on the growing surface is in a range between 10:1 and 1:10 so as to ensure that the surface atoms of Ga and O create the β-Ga2O3 crystal on the heated substrate; growing the core region of β-Ga2O3 at a thickness between 5 nm-2000 nm and at the growth rate between 10 nm/h-500 nm/h; maintaining the growing process on the core layer created in the previous step such that the β-Ga2O3 growth rate is in a range between 100 nm/h and 10 μm/h.

14 Claims, 3 Drawing Sheets

(56) References Cited

U.S. PATENT DOCUMENTS

| | | | |
|---|---|---|---|
| 2020/0181799 A1* | 6/2020 | Xiu | C30B 23/025 |
| 2022/0157946 A1* | 5/2022 | Fukui | H01L 21/02576 |

FOREIGN PATENT DOCUMENTS

| | | |
|---|---|---|
| EP | 3 352 200 A1 | 7/2018 |
| JP | 2019 034883 A | 1/1991 |
| WO | WO 2018/192689 A1 | 10/2018 |
| WO | WO 2019/218581 A1 | 11/2019 |

\* cited by examiner

METHOD FOR GROWING HIGH-QUALITY HETEROEPITAXIAL MONOCLINIC GALLIUM OXIDE CRYSTAL

FIELD OF THE DISCLOSURE

The present disclosure relates to semiconductive materials used in solar-blind photodetectors in the field of high voltage and power electronics and/or in the defense industry and missile tracking systems in the defense industry and in energy conversion, and particularly to a method for growing β-$Ga_2O_3$ crystal.

More specifically, the present disclosure relates to a method for growing a high-quality heteroepitaxial β-$Ga_2O_3$ crystal by specifically using the low-pressure chemical vapor deposition (LPCVD) method in the field of chemical vapor deposition.

BACKGROUND

Monoclinic gallium oxide (β-$Ga_2O_3$) crystal is known to possess low thermal conductivity (10-30 W/m·K.). Therefore, layers with 0.5-1 mm thickness pose big problems in the conduction of heat. On the other hand, the device layer thickness required in electronic devices is approximately 10-20 microns. Therefore, being able to grow 10-20 microns of β-$Ga_2O_3$ layer heteroepitaxially on substrates with high thermal conductivity and without impairing the quality of the crystal is of high significance in order to overcome this problem in the state of the art.

Considering the state of the art, β-$Ga_2O_3$ is still in the research and development stage in various institutions, and its potential as a material is still endeavored to be revealed experimentally. Indeed, there is no commercialized device production. Nowadays, the interest in gallium oxide (β-$Ga_2O_3$) is on the increase since it has been recently obtained in the form of ingots with high quality. In fact, based on the advantage provided by a broad bandwidth of approximately 4.8 eV, it is expected to have a higher breakdown voltage than its competitors. Its competitors in the industry and the basic material parameters thereof are shown in Table 1.

TABLE 1

Basic parameters of semiconductors with broad bandwidth.

| Parameter | SiC | GaN | β-$Ga_2O_3$ |
|---|---|---|---|
| Bandwidth (eV) | 3.3 | 3.4 | 4.8 |
| Critical Breakdown Electric Field (MV/cm) | 2.6 | 3.3 | 8 |
| Electron Mobility | 1000 | 1200 | 250 |
| Thermal Conductivity (W/mK) | 370 | 130 | 10-30 |

All high-quality β-$Ga_2O_3$-based electronic devices are produced by a growing process on homoepitaxial, namely, superposable substrates. The primary growing techniques for β-$Ga_2O_3$ thin films in the prior art are focused on homoepitaxy on commercially available $Ga_2O_3$ substrates by using particularly; Hydride Vapor Phase Epitaxy (HVPE), molecular beam epitaxy (MBE), and metal-organic vapor phase epitaxy (MOVPE).

Although several studies have been conducted on different substrates, these are far from the targeted crystal quality. In other words, β-$Ga_2O_3$ layers have been grown by means of thin-film techniques on β-$Ga_2O_3$ substrates cut from ingots. This means that β-$Ga_2O_3$ layers, which have a thermal conductivity of 10-30 W/mK, cannot be directly used in high power applications. The thermal conductivity value of β-$Ga_2O_3$ is 10-20 times lower than GaN and SiC competitors and it should have at least the same thermal conductivity level as its competitors to be able to compete with its counterparts. To that end, these studies stipulate disintegrating the substrate up to the device zone by means of a costly and risky process called substrate thinning or by cutting it via laser and subsequently, adhering it onto a carrier with high thermal conductivity. This, however, increases the costs and therefore, is an undesired process.

Thus, it is observed that the solutions available in the state of the art are insufficient for solving the existing problems.

The novel crystal growing method developed by the inventor enabled growing β-$Ga_2O_3$ layers with a record-high crystal quality on sapphire ($Al_2O_3$) substrate. A similar method (0001) allows for obtaining high-quality β-$Ga_2O_3$ layers on 4H- or 6H-SiC having high thermal conductivity (~400 W/m·K) compared to sapphire and a similar atomic plane (0001). Instead of utilizing all these processes in the state of the art as described above, it is possible to grow the β-$Ga_2O_3$ thin film layer, in which the device is fabricated, directly by heteroepitaxial growth on SiC with high thermal conductivity. In studies conducted by the inventors, high-quality β-$Ga_2O_3$ thin films on sapphire crystal, which has a surface structure (0001) that is very similar to SiC crystal, were obtained by means of the inventive method (0001). A similar method is expected to yield similar success on SiC with high thermal conductivity, and this is considered a technologically invaluable product.

Various problems were observed in terms of the price and the size of the product in addition to the problems encountered in thermal conductivity in the state of the art.

Despite the fact that β-$Ga_2O_3$ crystal may be grown in the form of an ingot, commercial products with an ingot diameter of 4 inches or less were introduced into the market. Various physical factors not only limit the diameter of the ingot but also shortens the physical life of iridium metal crucible used in the production. Due to these reasons, for example, the current market value of a 2-inch β-$Ga_2O_3$ substrate with a thickness of 0.5 mm is approximately 2000 $. This is on a similar price level with its commercial competitor SiC and weakens the potential competitive capacity of β-$Ga_2O_3$.

Sapphire crystal, on the other hand, is usually in a much cheaper price range and serves as a substrate with a diameter of 8 inches for several semiconductors in the market for a long time. For instance, the market value of a 2-inch sapphire substrate is approximately 10 $. Therefore, growing β-$Ga_2O_3$ with high crystal quality on a cheap, large-scale sapphire substrate has quickly become a center of attention.

While semiconductor devices are fabricated as commercial products, as many devices as possible are obtained at the same time on the same semiconductive plate by means of lithography processes on the entirety of the substrate. Therefore, plates with larger diameters are preferred due to the production rate and consequently, the cost thereof. The fact that sapphire substrates are available on the market with a large diameter of 8 inches and cheap prices, made sapphire substrates the ideal substrate for growing heteroepitaxial β-$Ga_2O_3$. Several different research groups tried to grow β-$Ga_2O_3$ with high crystal quality by using different thin film growing techniques, but none of them managed to obtain growths with the desired level of dislocation density, growth rate, and smooth surface morphology. X-ray diffraction crystallography (XRC) FWHM (Full Width At Half Maximum) measurement, which is directly related to dislocation density, is the most commonly used non-destructive method for measuring crystal quality in a wide scanning area like 1-2 mm. FWHM value decreases as the crystal quality increases. Since β-Ga$_2$O$_3$ (–201) oriented over (0001) sapphire has a similar atomic pattern, it may be grown as a single crystal.

The disclosure subject to American patent registration with the publication number of US20160265137A1 and titled "Method for growing beta-Ga2O3-based single crystal film, and crystalline layered structure" was found as a result of the search conducted in the state of the art, and it is observed that said disclosure discloses a method for growing a single beta-Ga2O3-based single crystal film by using HVPE method. In this method, the growing process may be performed at a growth temperature not lower than 900° C. Since the disclosure disclosed in this application utilizes a low-pressure chemical vapor deposition method, it fundamentally differs from the method disclosed in said document in the state of the art. Moreover, neither the process steps nor the reaction parameters are similar.

The disclosure disclosed in the European patent registration with the publication number of EP1182697B1 and titled "Sapphire substrate, electronic component, and method of its manufacture" is another document available in the state of the art, which briefly discloses; in a sapphire substrate having a heteroepitaxial growth surface, the heteroepitaxial growth surface is parallel to a plane obtained by rotating a (0110) plane of the sapphire substrate about a c-axis of the sapphire substrate through 8° to 20 in a crystal lattice of the sapphire substrate. Said application further discloses a semiconductor device, electronic component, and a crystal growing method. Said disclosure does not specifically mention a method for growing high-quality gallium oxide crystal. Furthermore, in the disclosure disclosed in this application, a surprise technical effect was obtained by working at specific values as it can be observed from the process steps. For example, it is important for the present disclosure for the substrate to be a (0001) oriented sapphire inclined by 6° in <11-20> direction.

In the state of the art, the disclosure that is the subject of the American patent registration with the publication number of US20200161504A1 and titled "Nanostructure" utilizes plasma-assisted, solid-state MBE technique. The temperature of the effusion cells can be used to control the growth rate in MBE. Convenient growth rates, as measured during conventional planar (layer-by-layer) growth, are 0.05 to 2 μm per hour, e.g. 0.1 μm per hour. The technique used herein is MBE and differs from the low-pressure chemical vapor deposition (LPCVD) technique used in the disclosure that is the subject of the application. Another document available in the state of the art, the disclosure that is the subject of the American patent registration with the publication number of U.S. Pat. No. 10,593,544A1 and titled "Method for forming a thin comprising an ultrawide bandgap oxide semiconductor" is based on the use of low-pressure chemical vapor deposition (LPCVD) method. The embodiments of said disclosure use a low-pressure chemical vapor deposition method that utilizes the vapor created upon vaporization of the material as a precursor, and in which the material has a low vapor pressure in the growth temperature for the thin film. Vapor is carried by an inert gas such as argon into a reaction chamber where it mixes with a second precursor. The reaction chamber is held at a pressure in which the nucleation of precursors preferably occurs on the surface of the substrate rather than from the vapor phase. Low vapor pressure of the material results in growth rates on the substrate surface that are significantly faster than the ones achieved by using the growing methods of the prior art. When the description of said disclosure is examined, it is observed that the system used in the implementation of the chemical vapor deposition technique in the process steps and the reaction parameters differ from the disclosure disclosed in the present application. Moreover, no guiding information was found regarding the technical effect provided to the disclosure by these different technical elements. Particularly, the surprisingly record value of XRC FWHM 0.049 of the heteroepitaxial β-Ga$_2$O$_3$ crystal obtained by means of the growing method developed by the inventor was not provided for the disclosure which is the subject of this application.

SUMMARY

The object of the present disclosure is to develop a novel method for growing high-quality heteroepitaxial β-Ga2O3 crystal by overcoming the problems existing in the state of the art disclosed above.

Another object of the present disclosure is to grow a β-Ga$_2$O$_3$ layer of 10-20 microns heteroepitaxially on substrates with high thermal conductivity and without impairing the quality of the crystal.

An indirect object of the present disclosure is to ensure that a high-quality β-Ga$_2$O$_3$ thin film layer is directly grown on SiC with high thermal conductivity by means of heteroepitaxial growth in which the device is fabricated differently from the methods utilized in the state of the art which necessitate performing additional processes.

Another object of the present disclosure is to enable growing cost-efficient β-Ga$_2$O$_3$ crystals with optimal quality.

Another object of the present disclosure is to grow a β-Ga$_2$O$_3$ crystal with an improved growth rate and smooth surface morphology.

An advantage of the present disclosure is that the XRC FWHM value, which is a value that shows the crystal quality, is obtained at a record-high value of 0.049 as a result of the studies conducted by the inventors.

DESCRIPTION OF THE REFERENCE NUMERALS

| NO | Part/Section Name |
|---|---|
| 1 | First Zone |
| 2 | Second Zone |
| 3 | Third Zone |

-continued

| NO | Part/Section Name |
|---|---|
| 4 | Pump |
| 5 | First Crucible |
| 6 | Second Crucible |

DETAILED DESCRIPTION

The present disclosure discloses the process steps of a method that is based on the chemical vapor deposition method and more specifically, the process steps of a method for growing high-quality heteroepitaxial β-$Ga_2O_3$ crystal by using low-pressure chemical vapor deposition method.

Figure 1:
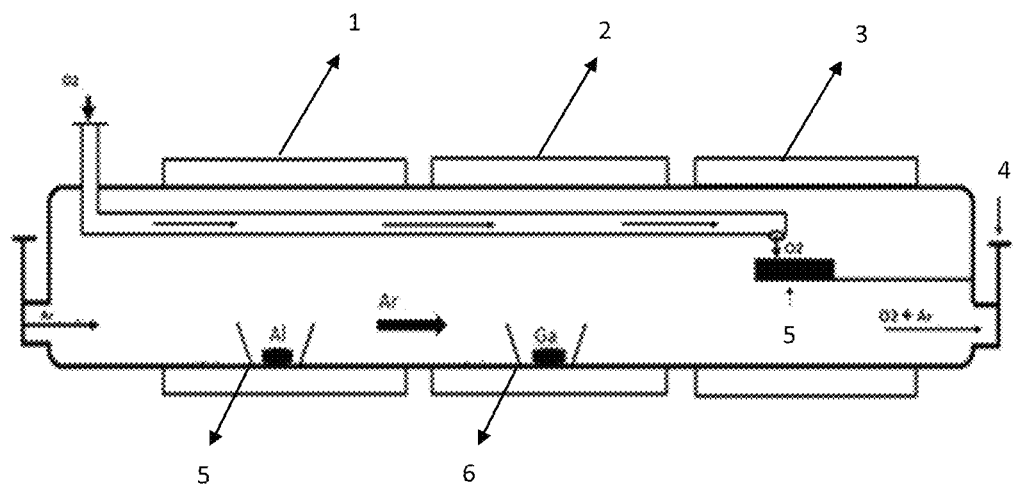
FIG. 1 illustrates the system geometry of the low-pressure chemical vapor deposition (LPCVD).

FIG. 1 illustrates the system geometry of the method utilized in the present disclosure. The system comprises a 3-zone furnace. In the system, argon gas physically carries the vapor, which is obtained from Gallium (Ga) heated in the second zone (2), towards the pump (4), namely, towards the sample. Oxygen is driven into the system in a separate quartz tube and transferred directly onto the surface of the sample in a vertical direction on the substrate. Thus, Ga and O surface atoms create the β-$Ga_2O_3$ crystal on the substrate that is heated to an appropriate temperature. Preferably, the substrate used herein is a (0001) oriented sapphire inclined by 6° in <11-20> direction. The substrate's inclination by specific degrees (2°-10°) has a deterministic effect on rendering the growing β-$Ga_2O_3$ layer a single crystal.

In the implementation of the inventive system, the entire system is held inside a single furnace with different heating zones at a high temperature. Keeping different metal crucibles in different zones allows for achieving the desired vapor pressures, thereby providing the opportunity for doping and alloying processes. As shown in FIG. 1, metal vapors are conveyed to distribution lines by means of noble gasses like Ar, and they are homogeneously distributed onto the sample by creating pixels at certain intervals. Analogously, $O_2$ (Oxygen gas) may also be transferred to the substrate through a different channel from designated pixel positions either directly or by being diluted with a carrier gas. In addition to these lines, it is also possible to drive gasses, which will ensure n or p-type doping (e.g., $SiC_4$, $H_2$, etc.), either through parallel lines or by mixing it directly into the line that is carrying $O_2$. The sample platform is a rotatable disk and is capable of holding a plurality of substrates. In the state of the art, such distribution structures are available as close-coupled showerhead chemical vapor deposition systems. In the system, carrier gas or oxygen diluted with a carrier gas is driven into the system from a position that is in close proximity of the center of the rotatable disk platform, thereby providing a radial flow for the gasses from the center of the disk towards the outer circumference thereof.

The inventive heteroepitaxial β-$Ga_2O_3$ crystal growing method with low-pressure chemical vapor deposition (LPCVD) method comprises process steps of:
a) Preparing the substrate having hexagonal surfaces cut in different directions with inclinations such that the inclination angle is in a range between 2° and 10°,
b) Physically carrying the vapor obtained from Gallium heated in the second zone (2) to the pump (4)/sample by means of the carrier gas (noble gasses),
c) Driving oxygen into the system with a separate ceramic or a refractory metal tube and transferring it onto the substrate directly from a distance of 0.1-4 cm and at an angle of 0°-90°,
d) Creating the core layer of β-$Ga_2O_3$ on the surface such that the ratio of Ga:O surface atoms on the growing surface is in a range between 10:1 and 1:10 so as to ensure that the surface atoms of Ga and O create the β-$Ga_2O_3$ crystal on the heated substrate,
e) Growing the core region of β-$Ga_2O_3$ at a thickness between 5 nm-2000 nm and at the growth rate between 10 nm/h-500 nm/h,
f) Maintaining the growing process on the core layer created in the previous step such that the β-$Ga_2O_3$ growth rate is in a range between 100 nm/h and 10 μm/h.

The substrate used herein is (0001) sapphire or (0001) SiC. (0001) sapphire and (0001) SiC have a similar surface atomic packing. In fact, high-quality β-$Ga_2O_3$ structures were obtained on sapphire as (−201) β-$Ga_2O_3$ complies with these planes. Although not in terms of cost, SiC provides a substantial motivation in terms of thermal conductivity. As stated before, the thermal conductivity of high-power electronic devices is an essential limiting factor.

Preferably, the substrate used in the present disclosure is a (0001) oriented sapphire inclined by 6° in <11-20> direction. Thus, it is ensured that the β-$Ga_2O_3$ layer that is being grown is a single crystal.

Preferably, Argon (Ar) is used as a carrier gas (noble gas) in the present disclosure. Moreover, a ceramic or refractory metal tube, which allows for driving oxygen into the system, is preferably made of quartz.

Heteroepitaxially obtained optimal β-$Ga_2O_3$ layer is fundamentally dependent on two conditions. First, nucleation is performed by maintaining a low growth rate. This value is in a range between 10 nm and 500 nm. The nucleation stage is disclosed in d) and e) steps given above.

Second, the adatom (surface atom) density ratio on the growing surface in step f) is in a range between 8:1 and 1:4 for Ga and O respectively. Preferably, this ratio is 2:3. Furthermore, in the present disclosure, preferably the ratio of Ga:O surface atoms on the growing surface in step d) is 2:3 respectively.

A characteristic of the inventive method for growing heteroepitaxial β-$Ga_2O_3$ crystal is that it comprises the process step of maintaining the sample temperature at 925° C. and adjusting the Ga crucible temperature to 795° C. in step d). Moreover, it further comprises the process step of raising the Ga crucible temperature to 920° C. in step f).

Figure 2:
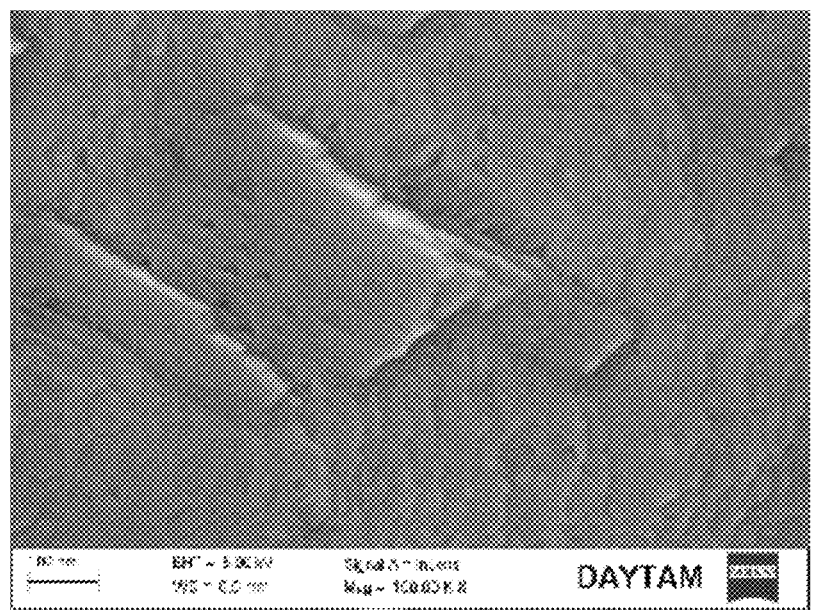
FIG. 2 illustrates the FE-SEM surface view of β-Ga$_2$O$_3$ layers grown on sapphire at a Ga crucible temperature of 795° C.
Figure 3:
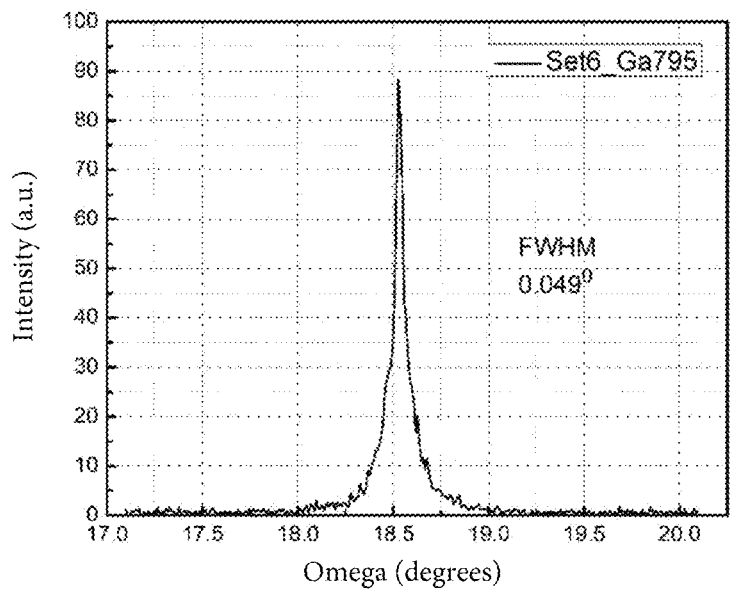
FIG. 3 illustrates the XRC measurement of β-Ga$_2$O$_3$ layers grown on sapphire at Ga crucible temperature of 795° C.

When the sample temperature was maintained at 925° C., Ar flow at 300 sccm, the distance between the Ga crucible and the sample was determined as 23 cm and when the Ga crucible temperature was adjusted as 795° C. by using the system shown in FIG. 1, scanning electron microscope surface images were obtained as shown in FIG. 2 and the oscillation curve scan was measured as shown in FIG. 3. Deviations in terms of atomic steps can be observed quite clearly. The XRC FWHM value, which is a value that indicates the crystal quality, was obtained at a record-high value of 0.049. This value proves the technical effects of the present disclosure with technical data.

Figure 4:
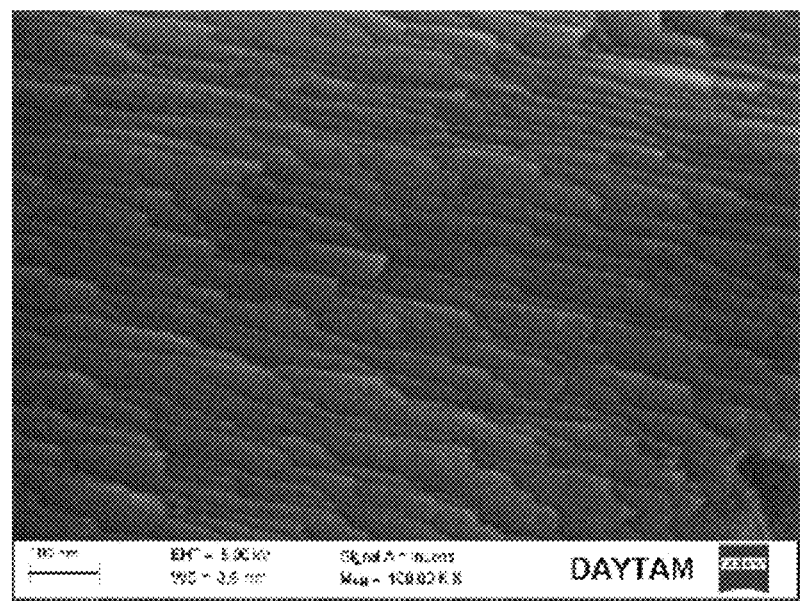
FIG. 4 illustrates the FE-SEM surface view of β-Ga$_2$O$_3$ layers grown on sapphire, at a Ga crucible temperature of 920° C.
Figure 5:
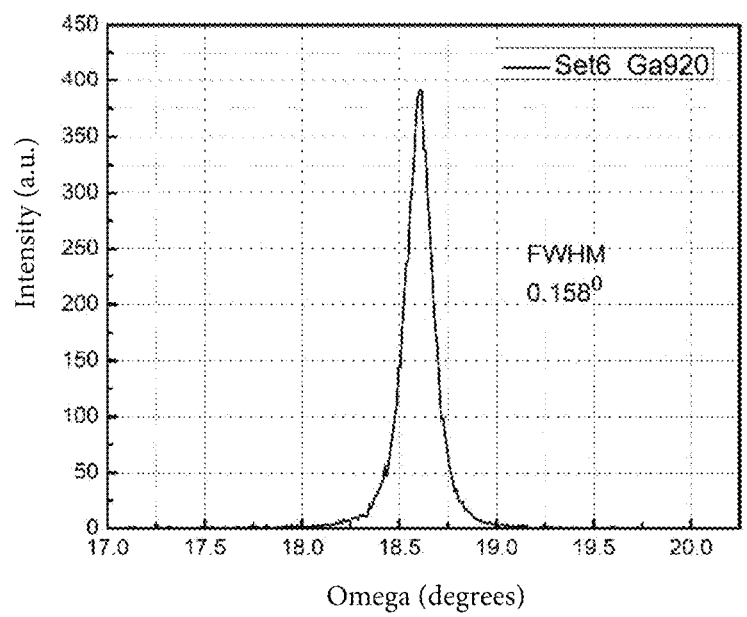
FIG. 5 illustrates the XRC measurement of β-Ga$_2$O$_3$ layers grown on sapphire, at a Ga crucible temperature of 920° C.

When the Ga crucible temperature was raised to 920° C. under the same growing conditions, the growth rate increased from 100 nm/h to 1000 nm/h, and the surface morphology (FIG. 4) evolved to much smoother and fully aligned atomic steps. The main factor here is that the 4 sccm's of $O_2$ flow provides Oxygen surface atom at much higher numbers when compared to the Ga surface atom number obtained from the Ga vapor at 795° C. As a matter of fact, Ga surface atom numbers at 920° C. were increased and Oxygen and Gallium surface atoms were obtained at relatively similar rates. Thus, the effect of the value that is close to the optimal Ga:O surface atom ratio, which is the first condition for high-quality growing, was observed. Even though surface morphology was better, the XRC FWHM value increased to 0.158°. Thus, the low growth rate requirement, which is the second condition for achieving optimal heteroepitaxy, was satisfied. As a matter of fact, the growth rate increased from 100 nm/h to 1000 nm/h upon the temperature increase of Ga as mentioned above and the reason behind this is that surface atoms form bonds by creating defects without even finding appropriate growing positions.

Briefly, two-stage growing is necessary for β-$Ga_2O_3$ heteroepitaxial CVD growth. In the first stage, nucleation is ensured at approximately 100 nm/h with the lowest number of defects, while the growing process continues at the rate of 1000-3000 nm/h on the high-quality nucleated β-$Ga_2O_3$ layer.

As different doping elements (Ge, Sn, Si, etc.) and molecules thereof ($N_2$, $H_2$, $SiCl_4$, etc.) may be used in both growing stages, the growing process may also be performed in an undoped manner.

In an embodiment of the present disclosure, the process step of; g) vaporizing solid source Ge inside the system or driving $SiCl_4$ gas into the system by mixing it with a carrier gas (noble gasses) for n-type doping of grown β-$Ga_2O_3$ is performed subsequent to the step f) in the inventive growing method.

X-ray diffraction signal width XRC FWHM values, which indicate the crystal quality achieved by various research groups, are listed in Table 2. As one can understand, an FWHM value of 0.049° that is much lower than the values in the literature was obtained by means of the inventive modified low-pressure vapor deposition system. This value was obtained by means of the growing method disclosed in the present disclosure. The lowest FWHM values obtained by means of other methods and/or obtained from grown heteroepitaxial $Ga_2O_3$ layers as disclosed in other patent documents are around 0.4-0.5. This value indicates that the inventive method allows for obtaining layers, defect densities of which are quite low. In fact, this value is of such high quality that it can be compared with some β-$Ga_2O_3$ layers grown in clusters and it is a little over the approximate FWHM (0.014°) value of optimized β-$Ga_2O_3$ substrates grown with record quality and in clusters. This particular difference is a natural result of dislocations that form subsequent to the growing process on foreign substrates, and it indicates a sufficient crystal quality for the devices to be manufactured.

TABLE 2

X-ray diffraction oscillation curve FWHM values and growth rate of β-Ga2O3 layers grown on (0001) sapphire with different growing systems.

|  | PECVD | MOCVD | HVPE | MBE | Standard LPCVD | The inventive method LPCVD |
|---|---|---|---|---|---|---|
| Growth Rate (μm/h) | 0.58 | 0.75 | 6 | <0.12 | 6 | 0.1 or higher |
| XRC FWHM | 0.8 | 0.6 | 1.48 | 0.68 | 0.47 | 0.049 |

The product obtained by means of the inventive method can be used in electric vehicle charging stations (at 600-1200V voltage-100 A current), in the operation of defense industry products operating with high electrical power, for example, in the production of transistors and diodes that can work under very high voltage (20-30 kV) and current (1000-3000 A) in the production of electromagnetic cannons (railguns).

Moreover, it can also be used in the manufacturing of electronic devices that are used for connecting solar panel farms and wind turbines.

Furthermore, it can also be used in the manufacturing of solar-blind photodetectors, in detectors that enable missile tracking, and for transferring data in underwater communications.

ABBREVIATIONS USED IN THE DESCRIPTION

LPCVD: Low-Pressure Chemical Vapor Deposition
CVD: Chemical Vapor Deposition
PECVD: Plasma-Enhanced Chemical Vapor Deposition
MOCVD: Metal-Organic Chemical Vapor Deposition
HVPE: Halogen Vapor-Phase Epitaxy
MBE: Molecular Beam Epitaxy
β-$Ga_2O_3$: Beta Gallium Oxide

The invention claimed is:

1. A method for growing a heteroepitaxial β-$Ga_2O_3$ (beta Gallium Oxide) crystal via low-pressure chemical vapor deposition (LPCVD), the method comprising:
for a system comprising a first zone for heating a substrate and a second zone for heating Gallium:
  a) Preparing the substrate having hexagonal surfaces cut in different directions with inclinations such that the inclination angle is in a range between 2° and 10°,
  b.) Physically carrying vapor obtained from Gallium heated in the second zone to a pump/sample via a carrier noble gas,
  c.) Driving oxygen into the system with a separate ceramic or a refractory metal tube and transferring the oxygen onto the sample directly over the substrate from a distance of 0.1-4 cm and at an angle of 0°-90°,
  d.) Forming a core layer of β-$Ga_2O_3$ on the surface such that a ratio of Ga:O surface atoms on a growing surface is in a range between 10:1 and 1:10 so as to ensure that the surface atoms of Ga and O create the β-$Ga_2O_3$ crystal on the heated substrate,
  e.) Growing the core layer of β-$Ga_2O_3$ at a thickness between 5 nm-2000 nm and at a growth rate between 10 nm/h-500 nm/h,
  f.) Maintaining the growing on the core layer created in step e) such that the β-$Ga_2O_3$ growth rate is in a range between 100 nm/h and 10 μm/h.

2. A method for growing a heteroepitaxial β-$Ga_2O_3$ crystal according to claim 1, wherein the ratio of Ga:O surface atoms on the growing surface in the process step f) is in a range between 8:1 and 1:4.

3. A method for growing a heteroepitaxial β-$Ga_2O_3$ crystal according to claim 2, wherein the ratio of Ga:O surface atoms on the growing surface in the process step f) is 2:3.

4. A method for growing a heteroepitaxial β-$Ga_2O_3$ crystal according to claim 1, wherein the ratio of Ga:O surface atoms on the growing surface in the process step d) is 2:3 respectively.

5. A method for growing a heteroepitaxial β-$Ga_2O_3$ crystal according to claim 1, wherein n-type or p-type layers are obtained by using different doping elements and/or molecules.

6. A method for growing a heteroepitaxial β-$Ga_2O_3$ crystal according to claim 5, wherein doping elements used are selected from Ge, Sn, Si, and/or molecules used are selected from $N_2$, $H_2$, $SiCl_4$.

7. A method for growing a heteroepitaxial β-$Ga_2O_3$ crystal according to claim 1, wherein the substrate is (0001) sapphire or (0001) SiC.

8. A method for growing a heteroepitaxial β-$Ga_2O_3$ crystal according to claim 1, wherein the substrate is a (0001) oriented sapphire inclined by 6° in the <11-20> direction.

9. A method for growing a heteroepitaxial β-$Ga_2O_3$ crystal according to claim 1, wherein the carrier noble gas is Argon (Ar).

10. A method for growing a heteroepitaxial β-$Ga_2O_3$ crystal according to claim 1, wherein ceramic or refractory metal tube is a quartz tube.

11. A method for growing a heteroepitaxial β-$Ga_2O_3$ crystal according to claim 1, further comprising: maintaining the sample temperature at 925° C. and, in step d), adjusting a Ga crucible temperature to 795° C.

12. A method for growing a heteroepitaxial β-$Ga_2O_3$ crystal according to claim 1, further comprising: increasing, in step f), temperature in a Ga crucible to 920° C.

13. A method for growing a heteroepitaxial β-$Ga_2O_3$ crystal according to claim 1, further comprising: g) vaporizing solid source Ge inside the system or driving SiCl4 gas into the system by mixing the SiCl4 gas with a carrier gas for n-type doping of grown β-$Ga_2O_3$ subsequent to step f).

14. A method for growing a heteroepitaxial β-$Ga_2O_3$ crystal according to claim 13, wherein the carrier gas is a noble gas.

* * * * *